United States Patent [19]

Majid et al.

[11] Patent Number: 5,687,067
[45] Date of Patent: Nov. 11, 1997

[54] LOW NOISE CONTROLLER FOR PULSE WIDTH MODULATED CONVERTERS

[75] Inventors: Naveed Majid, Mohegan Lake; Stephen L. Wong, Scarsdale, both of N.Y.

[73] Assignee: Philips Electronics North America Corporation, New York, N.Y.

[21] Appl. No.: 453,412

[22] Filed: May 30, 1995

[51] Int. Cl.[6] .................................................. H02M 7/5395
[52] U.S. Cl. .................................. 363/97; 363/21; 363/41
[58] Field of Search ................................ 363/20, 21, 41, 363/95, 97

[56] References Cited

U.S. PATENT DOCUMENTS

| | | | |
|---|---|---|---|
| 3,886,433 | 5/1975 | Watanabe | 363/95 |
| 4,628,428 | 12/1986 | Walker | 363/21 |
| 4,628,429 | 12/1986 | Walker | 363/21 |
| 4,700,285 | 10/1987 | Szepesi | 363/97 |
| 4,827,391 | 5/1989 | Sills | 363/41 |
| 4,885,674 | 12/1989 | Varga et al. | 363/21 |

*Primary Examiner*—Adolf Berhane
*Attorney, Agent, or Firm*—Michael E. Marion

[57] ABSTRACT

A controller for supplying a switching drive voltage signal to a semiconductor power switch includes a wave-shaper circuit that generates a piece wise linear (PWL) waveform that slows the rate of change of the drive voltage supplied to the control electrode of the semiconductor power switch. As a result, the radiated electromagnetic interference generated by the apparatus can be appreciably reduced.

13 Claims, 4 Drawing Sheets

5,687,067

LOW NOISE CONTROLLER FOR PULSE WIDTH MODULATED CONVERTERS

BACKGROUND OF THE INVENTION

This invention relates to a controller for supplying a switching signal to control the switching of a semiconductor power device in a pulse width modulated converter. More particularly, the invention relates to a controller which shapes the waveform of the switching signal so as to reduce the level of electromagnetic interference (EMI) or noise that is generated and radiated as a result of the switching of the converter semiconductor power device.

Pulse width modulated converters are extensively used in switched mode power supplies where efficient and compact power conversion is desirable. Conventional switched mode power supplies of this type produce pulse width modulated square-wave signals for driving the semiconductor power switch or switches. The duty cycle of the waveform is adjusted based upon information fed back from the output of the converter. These square-wave signals are normally generated by a pulse width modulation controller and are amplified by a buffer/driver which interfaces with a control electrode of the power switch(s).

FIG. 1 shows a functional block diagram of a conventional flyback converter that is used in a switched mode power supply of a TV receiver. The gate or control electrode of the semiconductor power switch is driven by a square-wave voltage waveform. It has been determined that the aforementioned type of square-wave control of the semiconductor power switch is a major contributor of radiated EMI noise in this kind of television receiver power supply. This can be explained in terms of the sharp di/dt and dv/dt transitions caused by the square-wave control. Because of the high rate of change of the voltage, dv/dt, of the square waveform, the current charging the gate capacitance of the semiconductor power device also has a high rate of change, di/dt. This leads to the generation of strong electrical (E) and magnetic (H) fields which interfere with the operation of other circuitry in the vicinity of the converter.

Thus, the square-wave switching of the power switch results in the generation and radiation of electromagnetic interference (EMI), which in the case of a television receiver is coupled into the receiver tuning circuits and results in visible noise on the television display screen, especially during the reception of weak or attenuated TV signals. This is a major problem in the design and manufacture of television receivers.

In order to minimize the EMI noise, conventional converters employ power stage elements (e.g. snubber elements, resonant circuit techniques, etc.) in various configurations. However, these techniques have very little impact on the rapid drive circuit transitions which contribute significantly to the generation of the EMI noise.

Recently, it has been suggested that the aforesaid noise problem can be reduced by the addition of a sinusoidal wave shaping circuit to the apparatus so as to drive the semiconductor power switch of the power supply converter with a sinusoidal waveform instead of the traditional square-wave drive waveform. This approach is described in detail in the copending U.S. application Ser. No. 08/280,747, filed Jul. 26, 1994 in the name J. J. Zahnen et al, and hereby incorporated by reference. Although this technique significantly reduces the EMI noise problem, unfortunately the switching losses (power) in the semiconductor power device increase above the levels of the conventional square-wave driven converters.

SUMMARY OF THE INVENTION

It is therefore an object of the present invention to provide an improved controller or converter which reduces the EMI noise problem and with a corresponding lower power dissipation or switching losses in the semiconductor power switch (es), thereby improving the overall efficiency of the apparatus and making it more reliable.

Another object of the invention is to provide a controller for a switched mode power supply (SMPS) which reduces the EMI noise generated to levels similar to those of a sinusoidal waveform drive circuit, but with lower power dissipation and switching losses in the power switch (s).

The above and other objects and advantages of the invention are achieved in a controller in accordance with the present invention, which supplies a switching drive signal to the semiconductor power switching device of a converter type switched mode power supply, by the generation of a so-called piece wise linear (PWL) drive waveform rather than the conventional square-wave drive waveform.

Applicants have discovered that if the square-wave controller is replaced by a PWL controller operating at the same switching frequency, the di/dt and dv/dt transitions can be minimized. Thus, by slowing down the rate of change of voltage of the waveform driving the gate of the power device, especially around the threshold voltage of the power device, the radiated EMI generated by the converter can be appreciably reduced.

The provision of a wave shaping circuit that produces a piece wise linear (PWL) waveform accomplishes this useful result in a particularly efficacious manner. An external voltage source providing a plurality of reference voltage levels is used to define the break points on the PWL waveform. By providing these reference voltages external to the switched mode power supply IC chip, the break points on the PWL waveform can be externally adjusted so that the rate of change of voltage is slowest around the threshold voltage of the power device. Because of the slow dv/dt of the gate drive waveform, the di/dt of the current charging the gate capacitance is slower. This leads to the generation of E and H fields that are much lower than in the case of the square-wave drive, and this in turn leads to lower generated and radiated EMI noise.

A preferred embodiment of the invention employs a current source bridge circuit coupled to a capacitor and with the current sources in the bridge circuit switched on and off in a particular sequence so as to derive the PWL waveform voltage across the capacitor, which in turn drives the control electrode of the power switch via a linear buffer circuit. The output voltage is compared with the externally supplied break point reference voltages so as to switch the current sources in the proper time sequence so as to produce the PWL waveform drive voltage.

Since the controller of the present invention eliminates the square-wave drive voltage of the prior art, parasitic ringing is absent in the circuit. Additionally, the PWL waveform applied to the gate of a MOSFET operating as the power switch in the switched mode power supply results in slow turn-on and turn-off of the device, which reduces any parasitic ringing associated with the switching. The controlled slowdown can be optimally achieved without excessive power dissipation and with lower power dissipation than in the case of a sinusoidal drive waveform.

BRIEF DESCRIPTION OF THE DRAWING

The invention will now be described in greater detail with reference to the accompanying drawings, in which.

DESCRIPTION OF THE PREFERRED EMBODIMENTS

Figure 1:
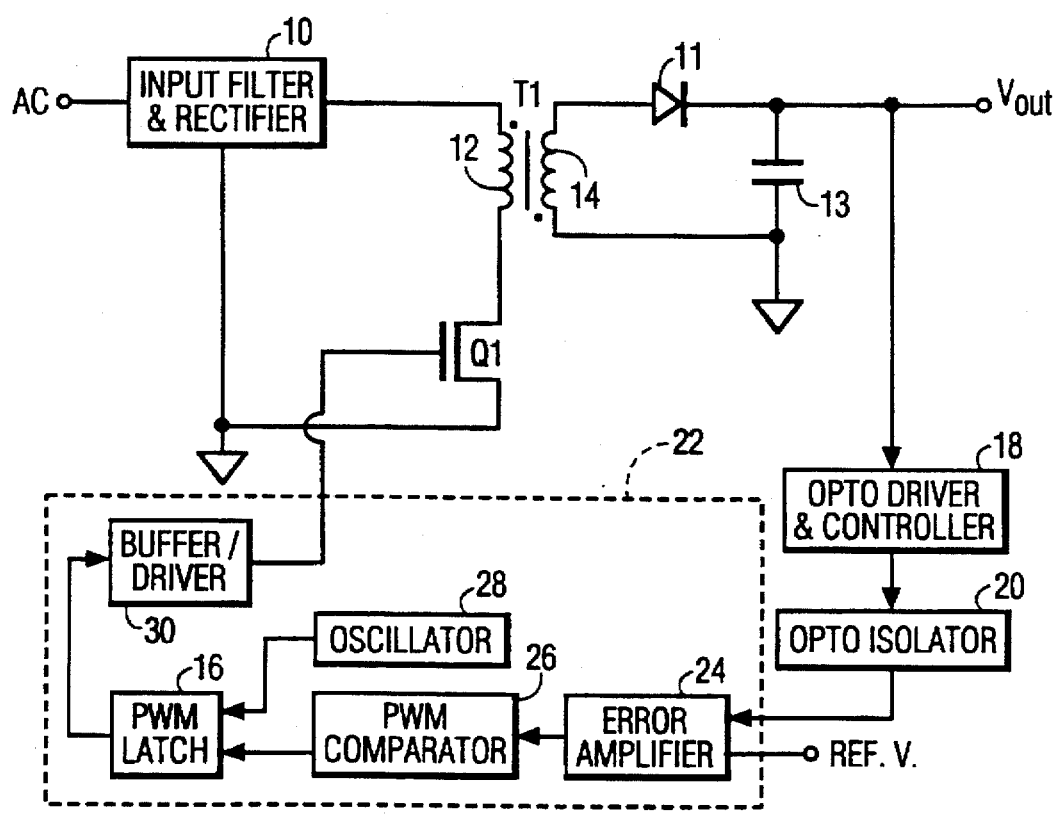
FIG. 1 is a block diagram of a switched mode power supply with a conventional square-wave controller.

FIG. 1 shows a switched mode power supply of the flyback type having a conventional square-wave controller. An input AC signal is applied to an input filter/rectifier circuit 10 having a connection to ground and an output coupled to one end of the primary winding 12 of a transformer T1. The other end of the primary winding 12 is connected through the source-drain junction of a MOSFET transistor Q1 to ground.

The transformer T1 further includes a secondary winding 14 coupled to a series arrangement of an output diode 11 and a capacitor 13. An output voltage $V_{out}$ is taken from the junction of the diode 11 and the capacitor 13 while the opposite end of the capacitor is connected to ground.

The output voltage $V_{out}$ is regulated and is used for generating a control signal for the controller. The output voltage $V_{out}$ is applied to an opto-driver and controller 18 which applies an output signal to an opto-isolator 20. The output signal from the opto-isolator 20 is applied as a feedback signal to the square-wave controller 22.

The square-wave controller includes an error amplifier 24 for receiving the output signal from the opto-isolator 20. The error amplifier compares the feedback signal from the opto-isolator to a reference voltage and amplifies the difference. The output of the error amplifier 24 is applied to the input of a PWM comparator 26. The output of the PWM comparator 26 is applied to one input of a PWM latch circuit 16. A second input of the PWM latch circuit is coupled to the output of an oscillator circuit 28.

The PWM comparator and the PWM latch circuit generate a pulse width modulated square waveform. The output of the PWM latch circuit in turn is coupled to a buffer/driver circuit 30. The output of the buffer/driver circuit 30 forms the output of the square-wave controller 22, which is applied to the gate of the MOSFET Q1. The buffer/driver supplies the necessary current handling capability to drive the gate of the power device Q1.

The flyback converter works by storing energy in the magnetic inductance of the transformer during each cycle when the power device is on and transfers the stored energy to the output when the power device is off. The converter can work in the discontinuous mode, which means that the current in the magnetic inductance of the transformer falls to zero before the power switch Q1 is turned back on. This flyback converter is subject to the EMI drawback discussed above.

Figure 2:
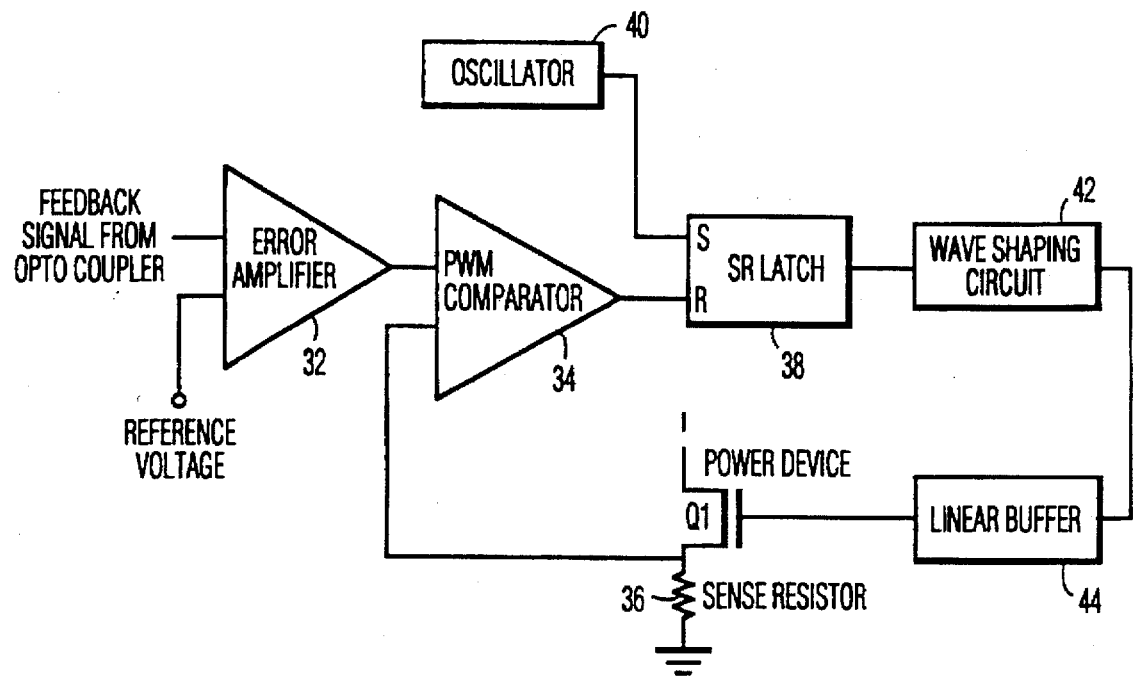
FIG. 2 is a simplified block diagram of the PWL pulse width modulated drive controller of the invention.

FIG. 2 shows a simplified block diagram of the controller of the subject invention. In particular, as with the conventional square-wave controller of FIG. 1, the output feedback signal from the opto-isolator (not shown) is applied to one input of an error amplifier 32. A second input of the error amplifier receives a reference voltage so that the opto-isolator output voltage is compared to this reference voltage.

The resultant signal is amplified and inverted and fed to the PWM comparator 34. The other input of the PWM comparator comes from a sense resistor 36 connected in series with the semiconductor power switch device Q1. The output of the PWM comparator is applied to the reset input R of a set-reset (SR) latch circuit 38. The set input S of the latch is coupled to the output of an oscillator 40, for example, a fifty KHz square-wave oscillator. The output of the latch is the input to the PWL wave shaping circuit 42. The wave shaping circuit is followed by a linear buffer circuit 44 which in turn drives the gate of the power device Q1. The wave shaper circuit 42 receives a pulse width modulated square-wave from the S/R latch circuit and in turn generates the PWL waveform.

In operation, the latch circuit is set by the square-wave oscillator 40. This in turn sets the output of the linear buffer 44 high and turns on the power device Q1. The current through the power device now starts to build up and the output voltage begins to increase. The increasing current through the power device is sensed by the sense resistor 36 and is fed to the PWM comparator 34. The output of the error amplifier will fall as the converter output voltage rises. When the sensed signal voltage is greater than the error amplifier voltage, the output of the PWM comparator is set to a high value. This resets the SR latch 38, which causes the linear buffer output to go low and turns the power device Q1 off. The cycle repeats itself when the output of the oscillator goes high again.

Figure 4:
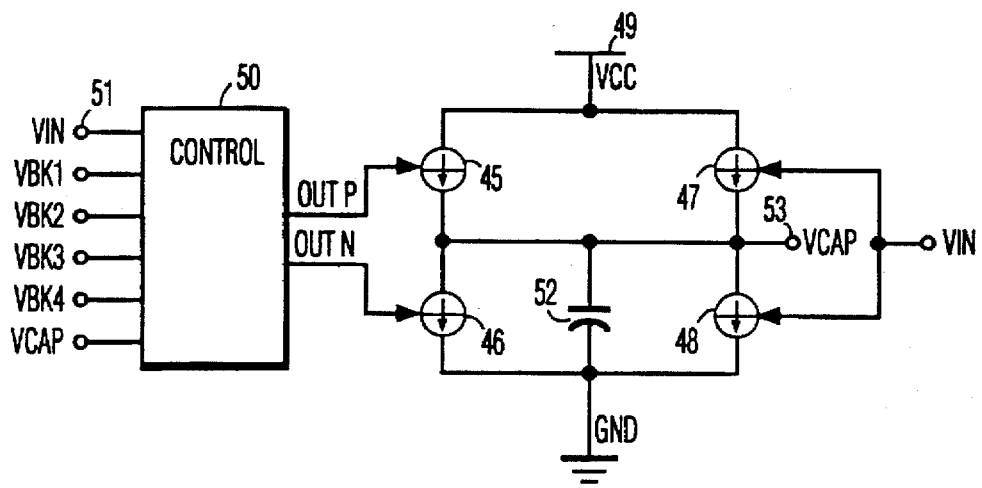
FIG. 4 shows a simplified version of one form of circuit that can be employed as the wave shaping circuit of FIG. 2.
Figure 3:
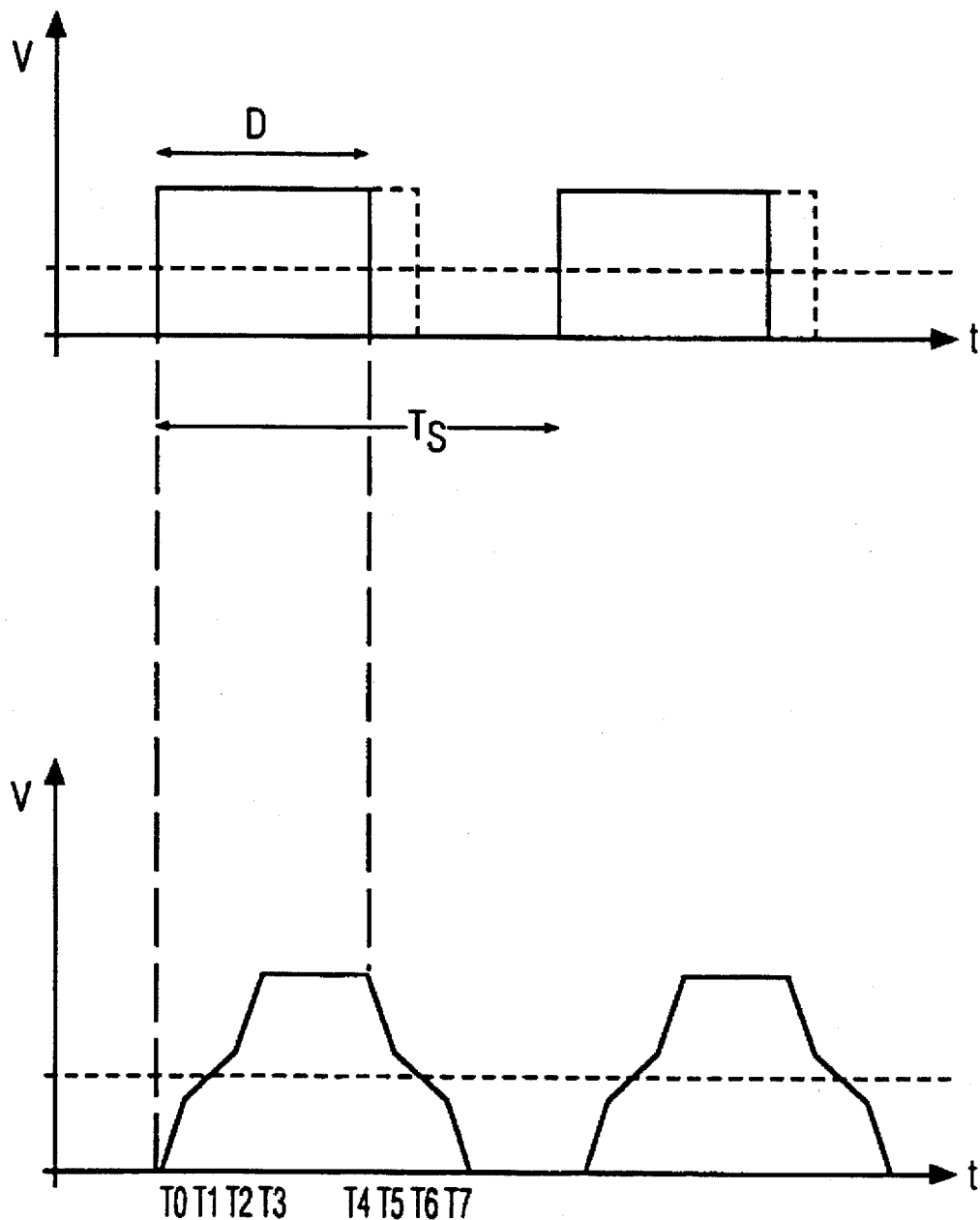
FIG. 3 provides a diagram of the PWL waveform produced by the wave shaping circuit of the invention.

FIG. 4 shows a simplified version of one form of a piece wise linear (PWL) wave shaping circuit that could be employed in the controller of FIG. 2. FIG. 3 is a time diagram useful in explaining the operation of the wave shaper circuit of FIG. 4. The PWL wave shaper circuit includes first, second, third and fourth current sources 45, 46, 47 and 48, respectively, arranged in a bridge circuit configuration between a terminal 49 of a source of DC supply voltage, $V_{cc}$, and a ground terminal. An output terminal 53 of the wave shaper circuit is coupled to a circuit node between current sources 47 and 48. A capacitor 52 is connected between the output terminal 53 and ground. The output or capacitor voltage $V_{cap}$, is supplied to linear buffer 44 (FIG. 2) and as an input to a control circuit (comparator) 50.

The control circuit 50 has output terminals OUTP and OUTN coupled to respective control terminals of the current sources 45 and 46 and, in response to a control signal ($V_{in}$) received at input terminal 51 and four break point voltages VBK1–VBK4, supplies control signals to the current sources 45 and 46 in a sequence that, in combination with the PWM square-wave signal supplied via the terminal $V_{in}$ to current sources 47, 48 from the output of the PWM latch circuit 38 (FIG. 2), will operate the current sources so as to charge (discharge) the capacitor 52 in a manner so as to produce across this capacitor a PWL voltage waveform such as that shown in FIG. 3 of the drawing.

As mentioned above, one main contributor of radiated EMI (electromagnetic interference) is the sharp rise of current (fast di/dt) which occurs when the gate capacitance of the power device Q1 (FIG. 2) is charged and discharged as the power device switches on and off. In order to reduce the rate of change of the gate charge current, di/dt, the novel gate drive controller of the present invention was developed which uses a piece wise linear (PWL, six segments) drive waveform instead of the traditional square waveform. The improvement in radiated EMI was remarkable.

The piece wise linear (PWL) wave shaper circuit makes use of the current sources to charge and discharge the capacitor 52 at different fixed rates during different time intervals in a manner so as to generate a PWL waveform from the pulse width modulated square wave output of the PWM latch 38 of FIG. 2 and which is received at input terminal 51 of control circuit 50. The wave shaper circuit receives the pulse width modulated square wave and in response generates a PWL waveform.

At time $t_0$, in FIG. 3, the input square wave voltage at terminal 51 goes high and current source 45 is turned on via terminal OUTP of control circuit 50 so that it starts charging the capacitor 52 at a first given constant rate. At time $t_1$, which is determined in the control circuit by comparing the amplitude of the capacitor output voltage $V_{cap}$ with a first breakpoint voltage, VBK1, the current source 48 is turned on. The net current charging capacitor 52 is now reduced and is equal to the difference of the currents in current sources 45 and 48. This slows the rate of charge of capacitor 52 with the result that the slope of the output voltage (VCAP) at terminal 53 is reduced, as can be seen in FIG. 3 between $t_1$ and $t_2$.

At time $t_2$, a second breakpoint occurs which is determined by comparing the capacitor voltage with the breakpoint reference voltage, VBK2, the current source 48 is turned off and capacitor 52 is again charged only by current source 45. Thus, by controlling the current charging capacitor 52, the voltage on this capacitor can be piece wise linearly shaped. More precisely, by controlling the times at which the different current sources are turned on and off to charge and discharge the capacitor 52, the output voltage is piece wise linearly wave shaped.

At time $t_3$, the current source 45 also is turned off. The capacitor 52 now maintains its charge voltage from time $t_3$ until time $t_4$ when current source 46 is turned on to discharge capacitor 52 at a fixed rate determined by this current source. At time $t_5$, the control circuit 50 in combination with the voltage $V_{in}$ applied to current sources 47 and 48 turns on current source 47 so that the capacitor 52 now discharges at a slower rate between times $t_5$ and $t_6$. At time $t_6$, the control circuit turns off current source 47 so that the capacitor now resumes its discharge at the higher rate which is determined by current source 46. The time $t_4$ coincides with the instant of time at which the input square wave voltage $V_{in}$ at input terminal 51 of the control circuit begins to fall. The break points at times $t_5$ and $t_6$ are determined by the break point voltages VBK3 and VBK4. When the rising edge of the input square wave voltage again appears, the foregoing sequence or cycle of operation is repeated.

Thus, by controlling the time at which different current sources are turned on and off to charge and discharge the capacitor 52, the capacitor output voltage is piece wise linearly wave shaped. The control (comparator) circuit controls the current sources. The inputs to the control Circuit are the four breakpoint reference voltages VBK1-4, the voltage VCAP of the capacitor, and the pulse width modulated square wave signal $V_{in}$. Based on the comparison of the voltages VBK1-4 and the capacitor voltage VCAP, the output signals, OUTP and OUTN, are set high or low. These signals, together with the signal $V_{in}$, control which current sources charge or discharge the capacitor 52 at given instants of time in a wave shaping cycle.

The current sources can be arranged so that the slope of the PWL waveform between times $t_0$ and $t_1$ and between $t_2$ and $t_3$ are different. Similarly for the times between $t_4$–$t_5$ and $t_6$–$t_7$. The slope or rate of change of the waveform between $t_1$–$t_2$ and between $t_5$–$t_6$, i.e. around the threshold voltage of the power switching device, is more gradual than between the other segments of the PWL waveform. By slowing down the rate of change of voltage of the waveform driving the gate of the power device, especially around the threshold voltage thereof, the radiated EMI generated by the converter can be appreciably reduced compared to a square wave drive waveform.

The rising and falling portions of the PWL waveform are divided into six linear segments in the example given, but may be divided into a different number of segments as requirements dictate. One form of control circuit (comparator) 50 for controlling the current sources 45–48 so as to derive a PWL output voltage waveform across the capacitor 52, i.e. at output terminal 53, is shown in greater detail in FIG. 5 of the drawing.

Figure 5:
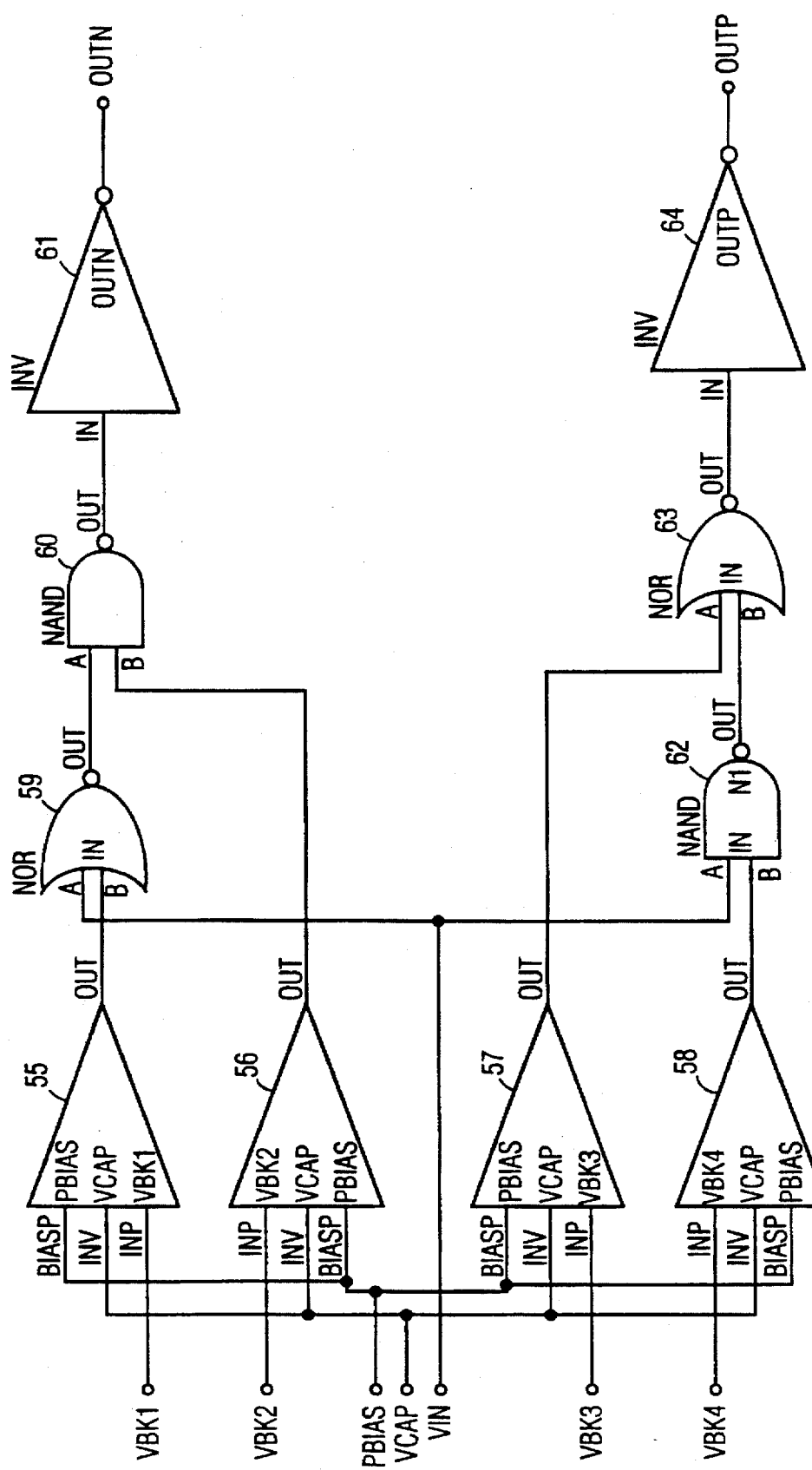
FIG. 5 shows a diagram of a control circuit for controlling the current sources in FIG. 4.

The control circuit in FIG. 5 includes four comparators 55–58 which receive as input voltages the four breakpoint reference voltages VBK1–VBK4, respectively, the output voltage of capacitor 52, VCAP, and a bias voltage, PBIAS. The output signals of the comparators are coupled, as shown, to a first cascade logic circuit consisting of NOR gate 59, NAND gate 60 and an inverter amplifier 61. Output signals of the comparators are also supplied to a second cascade logic circuit consisting of NAND gate 62, NOR gate 63 and an inverter amplifier 64. NOR gate 59 and NAND gate 62 also receive as inputs the PWM square wave signal ($V_{in}$) from the PWM latch 38 (FIG. 2). The output voltages OUTN and OUTP of the inverter amplifiers 61 and 64 control the current sources 46 and 45, respectively, in the wave shaping circuit of FIG. 4. The PBIAS input provides a bias signal for the comparator circuits 55–58.

As a result of the comparison of the voltage VCAP and the breakpoint voltages VBK1–4, the comparator circuits set the output signals OUTN and OUTP either high or low. Signals OUTP and OUTN in conjunction with the voltage $V_{in}$ then control the sequential operation of the current sources 45–48 as described above.

The breakpoint reference voltages VBK1–VBK4 are preferably supplied from outside the controller IC chip so that they can be externally controlled.

Although various alterations and modifications of the invention herein disclosed will become obvious to those skilled in the art based upon the above description, it is to be understood that the above described embodiments are for purposes of illustration only and are not to be construed as a limitation on the invention. All such modifications which do not depart from the spirit of the invention are intended to be included within the scope of the appended claims.

What is claimed is:

1. A controller for supplying a switching signal to a semiconductor power switch, wherein said controller comprises:

means for deriving a pulse width modulated square wave signal, means coupled to an output of said pulse width modulated square wave signal deriving means for generating a piece wise linear (PWL) switching signal, and means for coupling said PWL switching signal to a control electrode of said semiconductor power switch so as to control the switching thereof.

2. The controller as claimed in claim 1 wherein said piece wise linear signal generating means comprises a waveshaper circuit that produces a PWL signal waveform having a rate of change of voltage, dv/dt, which is slowest around the threshold voltage of the semiconductor power switch.

3. The controller as claimed in claim 1 wherein said piece wise linear signal generating means includes a wave-shaper circuit comprising:

first, second, third and fourth current sources connected together in a bridge circuit between a terminal of a source of supply voltage and a point of reference voltage, a capacitor coupled between an output terminal of the bridge circuit and said point of reference voltage, and a control circuit responsive to said square wave signal and a voltage developed across the capacitor and which is operative to supply control signals to switch said current sources on and off in a time sequence such as to derive a voltage with a PWL waveform across said capacitor.

4. The controller as claimed in claim 3 wherein said control circuit includes comparator means responsive to a plurality of break point voltages and to the capacitor voltage for deriving said switch control signals.

5. The controller as claimed in claim 3 wherein said control circuit includes comparator means responsive to a plurality of break point voltages and to the capacitor voltage and a logic circuit controlled by output means of the comparator means and said square wave signal so as to derive said switch control signals.

6. The controller as claimed in claim 5 wherein said control signals control said first and second current sources which are serially connected to form a first branch of the bridge circuit, and said square wave signal controls the operation of the third and fourth current sources which are serially connected to form a second branch of the bridge circuit.

7. The controller as claimed in claim 1 wherein said semiconductor power switch is part of a circuit for deriving a DC output voltage at an output terminal for connection to a load circuit, and said controller further comprises:

an error amplifier having a first input coupled to said output terminal and a second input coupled to a source of reference voltage, a PWM comparator having input means for receiving an output voltage of the error amplifier and a sense voltage proportional to a current flowing through the semiconductor power switch, a latch circuit having a first input coupled to an output of the PWM comparator, a square wave oscillator circuit having its output coupled to a second input of the latch circuit, and wherein an output of the latch circuit is coupled to an input of said piece wise linear signal generating means to supply it with said PWM square wave signal, said oscillator circuit, latch circuit and PWM comparator together forming said means for deriving a pulse width modulated square wave signal.

8. The controller as claimed in claim 1 wherein said piece wise linear signal generating means comprises a control means that generates a PWL waveform comprising a first linear segment with a relatively high slope, followed by a second linear segment with a lower slope, and followed by a third linear segment of relatively high slope.

9. The controller as claimed in claim 8 wherein said control means further generates fourth, fifth and sixth linear segments of said PWL waveform which are a mirror image of the third, second and first linear segments, respectively.

10. The controller as claimed in claim 9 wherein the slope of the first linear segment is equal to the slope of the third linear segment and the slope of the fourth linear segment is equal to the slope of the sixth linear segment.

11. The controller as claimed in claim 1 further comprising:

means for coupling the semiconductor power switch to an output circuit adapted to supply a DC output voltage to a load circuit, and wherein said PWM square wave signal deriving means comprises a PWM comparator having an input coupled to said output circuit and an output coupled to an input of said piece wise linear signal generating means.

12. The controller as claimed in claim 11 wherein said PWM comparator has a second receives a control voltage determined current flow through the semiconductor power switch whereby the PWM comparator is jointly controlled by the DC output voltage and the current flow through the semiconductor power switch.

13. A switching power supply with reduced generated electromagnetic interference (EMI) comprising:

a semiconductor power switch coupled to a source of supply voltage and to an output circuit adapted to supply a DC output voltage to a load circuit, means responsive to said DC output voltage for deriving a pulse width modulated square wave signal, means coupled to an output of said pulse width modulated square wave signal deriving means for generating a piece wise linear (PWL) switching signal having a slower dv/dt than that of a rectangular shaped drive waveform and of a value to reduce EMI generated, and means for coupling said PWL switching signal to a control electrode of said semiconductor power switch so as to control the switching thereof.

* * * * *